May 20, 1969 A. J. LEIDICH 3,445,776
PHASE SPLITTING CIRCUIT FOR A DIRECT COUPLED PUSH-PULL AMPLIFIER
Filed Dec. 19, 1966
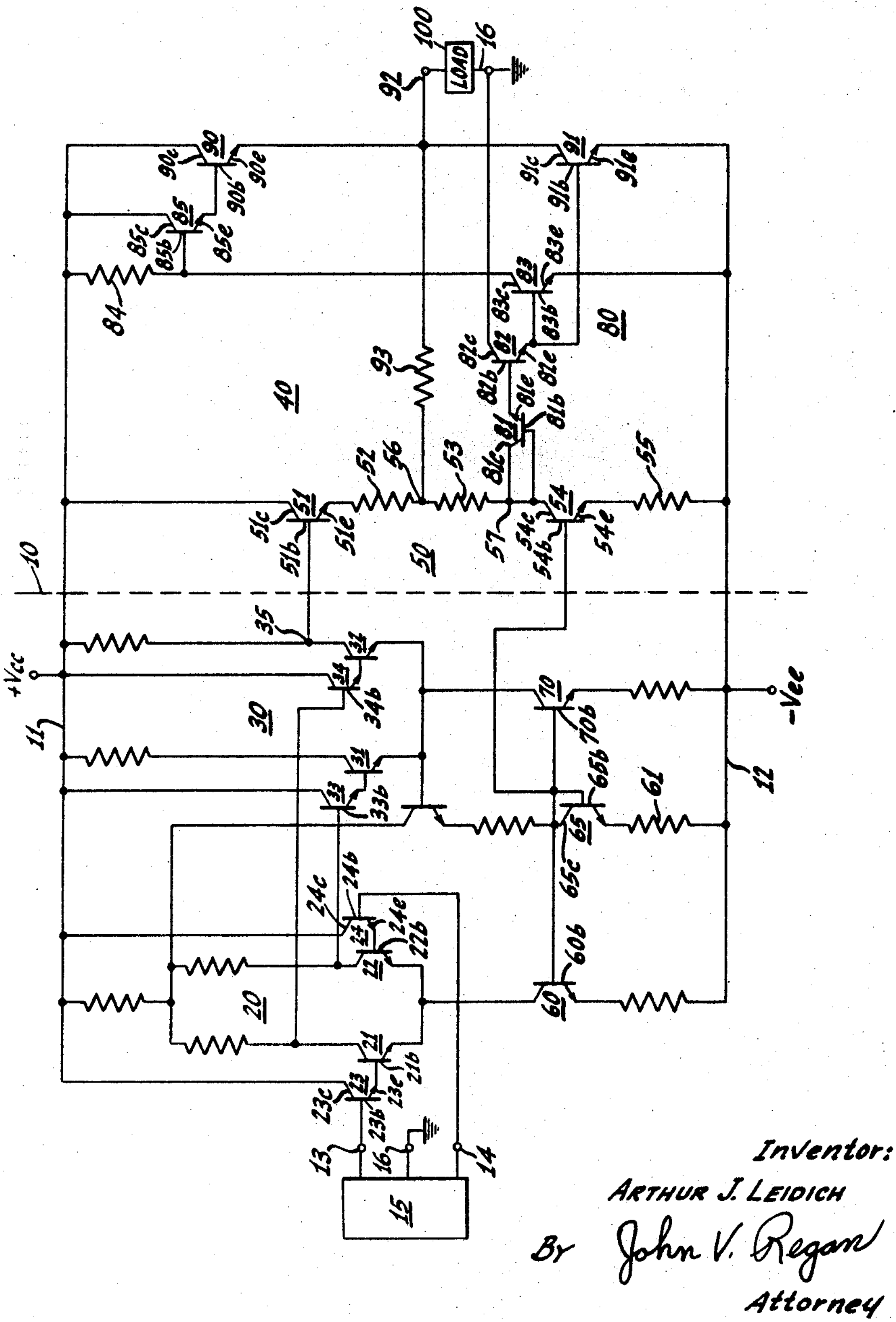
Inventor:
ARTHUR J. LEIDICH
By John V. Regan
Attorney United States Patent Office 3,445,776

Patented May 20, 1969

3,445,776

PHASE SPLITTING CIRCUIT FOR A DIRECT COUPLED PUSH-PULL AMPLIFIER

Arthur J. Leidich, Flemington, N.J., assignor to Radio Corporation of America, a corporation of Delaware Filed Dec. 19, 1966, Ser. No. 602,774
Int. Cl. H03f 3/26, 1/08, 1/34
U.S. Cl. 330—15 6 Claims

ABSTRACT OF THE DISCLOSURE

Direct coupled push-pull stage having a unique phase-splitting circuit in which an emitter follower drives both the inverting transistor and one push-pull transistor. The phase-splitting circuit has a low input insertion loss (or high overall gain) which enables the push-pull stage to have a relatively constant closed loop gain throughout an extremely wide range of load impedance values.

The present invention relates to signal translating systems and, in particular to a push-pull amplifying stage which is capable of being direct coupled to a single-ended driving source.

Push-pull stages of this type are useful as power output stages in such applications as operational amplifiers, servo-drivers, regulators and other direct coupled amplifier apparatus. In cascade-connected direct coupled amplifiers the direct current (D.C.) or quiescent voltage at the output electrode of one stage comprises the voltage which is applied to the next succeeding stage. In general, this D.C. voltage is offset from the amplifier reference, which may arbitrarily be considered as a ground or 0 volt reference. In direct coupled push-pull stages level shift means is generally employed to shift the level of this D.C. voltage to provide proper bias for a phase-splitting circuit which in turn operates a pair of push-pull output amplifying devices in such manner that the D.C. voltage at the output terminal of the push-pull stage is zero volt. In addition, feedback means is often employed to provide D.C. stabilization as well as uniform frequency response throughout the range of interest.

One problem associated with the design of direct coupled push-pull stages is that substantial signal attenuation or loss of signal occurs across the level shift means. To offset this signal attenuation the stage is designed to have a high gain. However, the dependency of gain on the value of load impedance and transconductance of the amplifying devices tends to restrict both the higher extreme of the power supply range and the lower extreme of the load impedance range throughout which the stage can effect a constant gain. That is, lower values of load impedance require the amplifying devices to conduct more current to maintain a constant gain such that the thermal ratings of the devices restrict the maximum power supply values.

It is an object of this invention to provide a novel and improved push-pull power output amplifying stage.

Another object is to provide a push-pull stage which is capable of being directly coupled to a single-ended driving stage.

Still another object is to provide a direct coupled push-pull stage in which constant gain is achieved throughout an extremely wide range of load impedance and power supply values.

Briefly, the present invention is embodied as amplifier apparatus which includes at least two cascade connected direct coupled stages wherein the output one of the stages is a push-pull stage and the input one of the stages drives the push-pull stage from a single-ended point. The push-pull stage includes a pair of amplifying devices arranged in circuit with a single-ended output terminal. Level shift means including first and second impedance elements, for example first and second resistors, is connected in a series direct current path with the driving point of the input stage. A feedback means includes a third resistance coupled between the output terminal and the juncture of the first and second resistors.

Phase-splitting means is coupled between the second resistor and the pair of amplifying devices and is arranged to operate the amplifying devices in a push-pull manner.

The phase-splitting circuit includes a follower type amplifying device connected to drive a phase inverting amplifying device in parallel with the lower one of the output amplifying devices. This arrangement presents a high input impedance relative to the level shifting resistors such that signal attenuation is minimized to the point where constant gain can be achieved throughout an extremely wide range of load impedance values. This arrangement additionally functions to clamp the one end of the second resistor to a voltage differing from the supply voltage by an amount sufficient to maintain a balanced bias condition for the pair of output amplifying devices. This clamping action together with the feedback resistor enables the stage to maintain this balanced condition throughout a wide range of power supply values.

Direct coupled amplifier apparatus according to my invention may be constructed either with discrete components or by means of integrated circuit processes. As used herein, the term, integrated circuit, refers to those technologies by which an entire circuit can be formed, as by diffusion or by thin films, in or on one or more chips of material, such as silicon. Direct coupled amplifiers are particularly suited for integrated circuit structures or devices since they employ no A.C. coupling elements such as transformers and capacitors, which elements are at the present time either impractical in the case of transformers, or not economically feasible, in the case of capacitors, to fabricate in integrated form. Integrated circuit structures or chips upon which amplifiers are formed are useful as basic building blocks which may be interconnected and combined with appropriate power supplies and signal sources to form various signal translating systems.

The push-pull amplifying stages of this invention are not limited in their application to use with any one particular type of amplifier apparatus. However, for the purpose of example and completeness of description, the sole figure of the drawing includes a schematic diagram of a direct coupled amplifier with which the push-pull stage may be employed as a power output stage. The direct coupled amplifier apparatus is designed to have a very high gain and is particularly suited for operational amplifier applications. Included in the operational amplifier apparatus are a pair of cascaded input stages 20 and 30 located to the left of a dashed line 10 and a push-pull power output stage 40 located to the right of the dashed line 10. Each of the stages 20 and 30 and 40 is connected between a pair of supply connections 11 and 12. The supply connection 11 is connected to a source of suitable operating potential, designated $+V_{cc}$ while the supply connection 12 is connected to another source of suitable operating potential, designated as $-V_{ee}$. The operating potential supplies $V_{cc}$ and $V_{ee}$ may comprise, for example, a three terminal supply providing symmetrical positive ($V_{cc}$) and negative ($V_{ee}$) voltages relative to a suitable reference such as circuit ground. In addition, bypass capacitors (not shown) may be connected between the ground reference and the supply connections 11 and 12.

The pair of input stages 20 and 30 are similar to the amplifier arrangements disclosed in my co-pending patent application for Amplifier, Ser. No. 441,090, filed, Mar. 19, 1965. As disclosed therein, each of the input stages 20 and 30 includes a pair of amplifying devices (e.g., the transistors 21 and 22 in stage 20) connected in a differential amplifier configuration. Each of the stages 20 and 30 differ from the amplifier arrangements disclosed in my co-pending application in that input transistors 23 and 24 have been added to stage 20 and input transistors 33 and 34 have been added to stage 30.

In stage 20, for example, the transistors 23 and 24 have their emitter electrodes 23*e* and 24*e* connected to the base electrodes 21*b* and 22*b*, respectively. The collector electrodes 23*c* and 24*c* are connected to the supply connection 11; while the base electrodes 23*b* and 24*b* are connected to input terminals 13 and 14, respectively. The input terminals 13 and 14 are adapted to receive input signal voltage from a driving source 15. The driving source 15 is shown to have a further connection to a terminal 16 which is connected to a source of suitable reference potential, illustrated in the drawing as ground by the conventional symbol therefore. The source 15 may be any suitable source which is capable of driving the input terminals 13 and 14 in a differential mode.

In stage 30, the transistors 33 and 34 have their base electrodes 33*b* and 34*b* connected by way of direct coupling to the differential outputs of the stage 20. The emitter and collector circuits for the transistors 33 and 34 are similar to those for the transistors 23 and 24 in stage 20.

These additional transistors in each of the stages 20 and 30 provide improved high frequency response for each of the amplifier stages 20 and 30. In essence, the transistor 23, for example, provides an impedance transformation of the source impedance $Z_s$ of the source 15, such that the Miller capacity $C_m$ of transistor 21 is effectively in parallel with $Z_s/\beta$ where $\beta$ is the current amplification factor of transistor 23. Since bandwidth is proportional to the product of source impedance and input capacitance, the bandwidth is effectively increased by a factor of $\beta$. It should be noted that since the collector electrodes of each of the transistors 23 and 24 and 33 and 34 are connected to the supply connection 11, none of these transistors has voltage gain, and hence there is substantially no Miller effect associated with any of them.

A further difference between the stages 20 and 30 and the amplifier configurations shown in my co-pending application is in the bias arrangement for the current determining transistors 60 and 70. The primary difference here is that the base electrodes 60*b* and 70*b* share a common base circuit rather than having separate base circuits. The common base circuit is illustrated as including a series connection of a temperature compensating diode and a resistance. The diode is illustrated as a transistor 65 having its base electrode 65*b* and its collector electrode 65*c* connected in common with the base electrodes 60*b* and 70*b*. The emitter electrode 65*b* is connected by way of resistance 61 to the supply connection 12. The series connection of the resistance 61 and the base-emitter junction of transistor 65 provides temperature compensation for transistors 60 and 70 in the well-known manner.

For a detailed description of the operation of the input stages 20 and 30, reference is made to my aforementioned co-pending application. For the purpose of the description which follows, suffice it to say that the input signal voltage supplied by source 15 is amplified by the two stages and appears at the single-ended output point 35 in stage 30. In addition to the amplified signal voltage, there is also a D.C. voltage at point 35 which is offset from the amplified reference or ground potential.

Stage 30 acts as a driving stage to provide single-ended drive from output point 35 to the push-pull power output stage 40. In push-pull stage 40, the signal voltage is translated from the driving point 35 via a level shift means 50 to a phase-splitting circuit 80 which is arranged to bias and operate a pair of amplifying devices 90 and 91 in a push-pull manner.

The level shift means 50 is connected between the driving point 35 and the $V_{ee}$ supply connection 12 and is essentially a voltage divider providing a shift in D.C. voltage level between point 35 and an intermediate divider point 57. The upper portion of the divider includes a transistor 51 and resistors 52 and 53; while the lower portion includes a current source transistor 54. The transistor 51 is connected in the common collector configuration and arranged for class A operation. Transistor 51 has its base electrode 51*b* connected to the driving point 35, its collector electrode 51*c* connected to the supply connection 11 and its emitter electrode 51*e* connected by way of resistors 52 and 53 to the intermediate divider point 57. The lower portion of the divider includes a current source transistor 54 arranged to provide a substantially constant current flow through resistors 52 and 53 in order to effect a level shift in voltage between driving point 35 and divider point 57. To this end transistor 54 has its collector electrode 54*c* connected to divider point 57 and its emitter electrode 54*e* connected by way of an emitter resistor 55 to the supply connection 12. The base electrode 54*b* of current source transistor 54 may be connected in any suitable base circuit which operates transistor 54 as a substantially constant current source. In the illustrated circuit, the base electrode 54*b* is shown to share the previously mentioned common base circuit with current source transistor 60 and 70 in stages 20 and 30, respectively.

The signal voltage is translated to the intermediate divider point 57 and applied to the phase-splitting circuit 80. The phase-splitting circuit 80 includes three transistors, 81, 82 and 83, the base-emitter junctions of which are arranged in a circuit path across the lower portion of the level shifting voltage divider to clamp point 57 to a voltage which differs from the supply voltage $V_{ee}$ by the base-emitter junction voltage drops of these transistors. Transistor 81 is essentially a diode in that both its collector electrode 81*c* and base electrode 81*b* are connected together to the collector electrode 54*c*; while its emitter electrode is connected to the base electrode 82*b* of emitter follower transistor 82. If desired, transistor 81 could be a diode connected for forward current flow in the same direction as the base-emitter junction of the transistor 81.

Emitter follower transistor 82 is arranged for class A operation and provides bias and signal voltage drive for phase-inverting transistor 83 and push-pull output transistor 91. To this end transistor 82 has its collector electrode 82*c* connected to circuit ground 16 and its emitter electrode 82*e* connected to the base electrode 83*b* of transistor 83 and the base electrode 91*b* of transistor 91. The emitter electrode 83*e* of phase-inverting transistor 83 is connected to the supply connection 12 and completes the clamping circuit for the divider point 57. The collector electrode 83*c* is connected to the supply connection 11 by way of collector resistor 84. The collector electrode 83*c* is further connected to the base electrode 85*b* of an impedance transforming transistor 85. The transistor 85 is arranged in a compound transistor connection with the push-pull output transistor 90. To this end the collector electrodes 85*c* and 90*c* are connected together to the supply connection 11; while emitter electrode 85*e* is connected to the base electrode 90*b*.

The push-pull output transistors 90 and 91 are arranged in circuit with an output terminal 92 in a single-ended fashion. The output terminal 92 is connected to the emitter electrode 90*e* of transistor 90 and the collector electrode 91*c* of transistor 91. To complete the circuit, the emitter electrode 91*e* of transistor 91 is connected to the supply connection 12. A feedback path including a resistance 93 is connected between the output terminal 92 and junction 56 between the resistors 52 and 53. A suitable load or utilization device 100 is connected between the output terminal 92 and the circuit ground connection 16.

In the illustrated example of the invention, it is preferred to operate the push-pull stage 40 in the class AB mode in order to minimize cross-over distortion. In addition, it is preferred that in the no signal or idle condition the D.C. voltage at output terminal 92 be the same as the reference potential 16 which, for the illustrated example, is ground or 0 volt. Thus, the design of stage 40 is such that in the idle condition all of the transistors are biased class A whereby transistors 90 and 91 conduct sufficient current to provide a D.C. voltage of 0 volt at output terminal 92. When signal voltage is applied, the phase-splitting circuit 80 splits the phase of the signal and applies out-of-phase signals to the push-pull transistors 90 and 91. For positive portions of the signal voltage, the transistor 91 is driven further into conduction to provide negative output voltage across the load; while the transistor 83 inverts the positive signal portions to drive the transistor 90 into cut off. For negative portions of the signal voltage, the transistor 91 is driven into cut off; while the transistor 83 inverts the negative signal portions to drive the transistor 90 further into conduction thereby providing positive output voltage across the load 100. For small amplitude signal voltage of either polarity, both transistors 90 and 91 are conducting to minimize cross-over distortion.

The phase-splitting circuit 80 including transistors 82 and 83 because of its low input insertion loss (or high overall gain) enables the push-pull stage 40 to have a relatively constant closed loop gain throughout an extremely wide range of load impedance values. This range, in an integrated circuit by way of example, extends from values on the order of 200 ohms to values on the order of 10 kilohms or more. Moreover, the stage 40 is capable of maintaining this constant closed loop gain characteristic for power supply values on the order of ±6 volts as well as for values on the order of ±24 volts.

The circuit configuration of transistors 82 and 83 presents a relatively high impedance which compares favorably with the resistances of the level shifting resistors 52 and 53 so that signal attenuation or loss of signal voltage across resistors 52 and 53 is minimized to the point where the above-mentioned constant closed loop gain characteristic can be achieved. Transistor 83 not only provides the required inversion of signal voltage, but also provides by way of its base-emitter junction a $V_{BE}$ (base-emitter junction voltage drop) bias for output transistor 91. This type of bias in conjunction with transistor 82 provides a distinct advantage in input impedance over the type of phase-splitting circuit which utilizes a single phase-splitting transistor with a diode in its emitter circuit to provide bias for the output transistor. The input impedance of the single transistor phase-splitter is $(1+\beta)$ times the emitter resistance of the transistor ($r_e$) in series with the parallel combination of the diode forward impedance and the input impedance of common emitter transistor 91. Since this transistor and the diode are conducting essentially the same current, their impedances are essentially equal. Neglecting the input impedance of transistor 91, which is high relative to the diode's conduction impedance, the input impedance of the single transistor phase-splitter is $2(1+\beta)r_e$.

On the other hand, the impedance of the phase-splitter 80 in the present invention is $(1+\beta_{82})$ times $r_{e82}$ appearing in series with the parallel combination of the input impedances of common emitter transistors 83 and 91. If transistors 83 and 91 are matched, then this can be written as $(1+\beta_{82})[r_{e82}+(1+\beta_{83})r_{e83/2}]$. The factor of 1/2 appears because the input impedances of transistors 83 and 91 are equal and appear in parallel. Furthermore, since the emitter current of transistor 82 is the sum of the base currents of transistors 83 and 91 and since a transistor's emitter impedance is inversely proportional to its emitter current, the emitter impedance of transistor 82 is equal to $(1+\beta_{83})r_{e38/2}$. Thus, the input impedance of the phase-splitter 80 is $(1+\beta_{82})(1+\beta_{83})r_{e83}$, which is a factor of $(1+\beta_{82})/2$ improvement over the single transistor phase-splitter. This factor of improvement is normally at least one order of magnitude and compares more favorably with the resistances of level shift resistors 52 and 53 such that less signal attenuation occurs thereacross and high resistor values (52 and 53) can be used. Since this input impedance is indeed a much larger value, the dissipation can be decreased by increasing resistor values.

The exemplary circuit illustrated in the drawing has been designed with a low enough dissipation so that power supply values from 6 volts to 24 volts do not cause an excession of thermal ratings. Moreover, this improvement in input impedance level has been accomplished by eliminating a diode and adding one transistor as compared to the single transistor phase-splitter. The minimization of signal attenuation is such that the open loop gain of stage 40 can be given a high enough value to enable the closed loop gain to approach a value equal to the ratio of feedback resistor 93 divided by level shift resistor 52. In essence, what this means is that an A.C. virtual ground is created at point 56 such that push-pull stage 40 itself acts like an operational amplifier. In addition, the level shift circuit 50 is designed so that there is also an effective D.C. ground at point 56, which together with the 0 volt D.C. condition at output terminal 92 insures that there is ideally no feedback current during the idle or no signal condition. If either of the supplies $V_{ee}$ or $V_{cc}$ drift, a slowly varying drift signal would be translated by the push-pull stage 40 and fed back negatively via resistor 93 in such a manner tending to D.C. stabilize the stage 40.

The clamping action of point 57 by the PN base-emitter junctions of transistors 81, 82 and 83 maintains this point at a value of about 2 volts (assuming silicon type transistors) more positive than the $V_{ee}$ supply voltage. The voltage at point 57 can move only a few millivolts about this nominal value. It is these few millivolts that determine cut off or saturation in transistors 90 and 91. If one of these transistors is turned on the other is turned off by virtue of the actuating signal inversion provided by transistor 83. The feedback resistor 93 senses the output condition and alters the voltage at point 57 until the transistors 90 and 91 are essentially in the same state of bias (nearly off except for a small idle current through each). It is due to the fact that only a few millivolts change is required at the point 57 to create this balanced condition that the feedback resistor 93 can effect it over a wide range supply values.

The illustrated embodiment of the invention is especially suitable for monolithic integrated circuit technology in that only transistors of the same conductivity type are employed. It should be noted that the illustrated NPN transistors could just as well be replaced with PNP transistors so long as the polarities of the supplies $V_{ee}$ and $V_{cc}$ are accordingly changed.

What is claimed is:

1. The combination comprising first and second operating power terminal means adapted to receive operating voltage of first and second values, respectively, first, second, third and fourth amplifying devices, each having an input, an output and a common lead, the output and common leads of the first and second devices being coupled in series across the first and second power terminal means, the output and common leads of the third device being coupled across the first and second power terminals, first means for direct coupling the third device output lead to the first device input lead, a point of reference potential having a third value intermediate the first and second value, second means for direct coupling the fourth device as a voltage follower to drive both the second and third devices, said second direct coupling means including first connection means between the fourth device common lead and the point of reference potential and second connection means between the fourth device output lead and the input leads of both the second and third devices, said second connection means being the sole connection to the fourth device output lead, input circuit means adapted to produce at an input circuit lead signals and a D.C. voltage having a value intermediate the first and second values and different than the third value, level shift means direct-coupled across the power terminal means and including first impedance means direct-coupled between the input circuit lead and the fourth device input lead, and output means including a connection to the common connection of the series coupled first and second devices.

2. The invention according to claim 1 wherein each of said amplifying devices is a transistor having a base, emitter and a collector lead, all of said transistors being of like conductivity, and wherein the base, emitter and collector leads of the first and third transistors correspond to the input, common and output leads, respectively, and the base, collector and emitter leads of the second and fourth transistors correspond to the input, common and output leads, respectively.

3. The invention according to claim 2 wherein said first direct coupling means includes a fifth transistor, and wherein said first and fifth transistors are connected in a compound transistor configuration.

4. The invention according to claim 3 wherein said impedance means includes series connected resistance means and diode means, the diode means being connected for forward current conduction in the same direction as the base-emitter junction of the fourth transistor, and wherein a feedback impedance means is direct-coupled between the output means connection and an intermediate point of the resistance means.

5. The invention according to claim 4 wherein said level shift means includes a sixth transistor having a base lead connected to said input circuit lead, a collector lead connected to said first power terminal means and an emitter lead connected in series with said resistance means, and wherein said level shift means further includes a current source transistor having a current path connected to the common junction of the series resistance means and the diode means.

6. The invention according to claim 5 wherein operating potential source means is connected to said first and second power terminal means for applying operating voltages of said first and second values thereto, and wherein a source of signal voltage is provided for applying signal voltage to said input circuit means.

References Cited

UNITED STATES PATENTS

| | | | |
|---|---|---|---|
| 2,663,806 | 12/1953 | Darlington | 330—20 X |
| 3,023,368 | 2/1962 | Erath | 330—14 |
| 3,102,984 | 9/1963 | Locanthi | 330—15 X |

ROY LAKE, *Primary Examiner.*

SIEGFRIED H. GRIMM, *Assistant Examiner.*

U.S. Cl. X.R.

330—18, 19, 20, 25, 28